(12) United States Patent
Park et al.

(10) Patent No.: US 8,411,458 B2
(45) Date of Patent: Apr. 2, 2013

(54) APPARATUS CAPABLE OF SELECTIVELY USING DIFFERENT TYPES OF CONNECTORS

(75) Inventors: Kwang-soo Park, Suwon-si (KR); Kyung-suk Kim, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 369 days.

(21) Appl. No.: 12/784,549

(22) Filed: May 21, 2010

(65) Prior Publication Data
US 2011/0063790 A1 Mar. 17, 2011

(30) Foreign Application Priority Data
Sep. 14, 2009 (KR) .......................... 10-2009-0086664

(51) Int. Cl.
*H05K 7/00* (2006.01)

(52) U.S. Cl. ............... 361/782; 361/679.09; 361/679.26; 361/749; 361/751; 361/760; 174/255; 174/258; 257/200; 235/492

(58) Field of Classification Search .................. 361/782, 361/679.09, 679.26, 749, 751, 760; 174/255, 174/258; 257/200; 235/492
See application file for complete search history.

(56) References Cited

U.S. PATENT DOCUMENTS
7,305,509 B2   12/2007   Fuller et al.

FOREIGN PATENT DOCUMENTS
JP   2008-091707   4/2008
KR   100814375    3/2008

*Primary Examiner* — Xiaoliang Chen
(74) *Attorney, Agent, or Firm* — F. Chau & Associates, LLC

(57) ABSTRACT

An apparatus capable of selectively applying different types of connectors to a substrate is disclosed. The memory apparatus includes a substrate having a controller. First and second connector pads may be arranged on edges of top and bottom surfaces of the substrate. A via hole may be arranged between the controller and the first and second connector pads. A first passive device pad may be arranged between the via hole and the first connector pads. A second passive device pad may be arranged between the via hole and the second connector pads. A passive device may be coupled to only one of the first passive device pad or the second passive device pad.

9 Claims, 9 Drawing Sheets

(a) Open stub (b) Short stub

APPARATUS CAPABLE OF SELECTIVELY USING DIFFERENT TYPES OF CONNECTORS

CROSS-REFERENCE TO RELATED APPLICATIONS

This application claims the benefit of Korean Patent Application No. 10-2009-0086664, filed on Sep. 14, 2009, in the Korean Intellectual Property Office, the disclosure of which is incorporated by reference herein in its entirety.

BACKGROUND

The inventive concept relates to a memory apparatus used in electronic devices, and more particularly, to a printed circuit board (PCB) design structure capable of selectively using different types of connectors in a PCB used in a solid-state drive (SSD), and preventing deterioration of signal characteristics in high-speed operations.

Until now, hard disk drives (HDDs) have been generally used as large capacity digital media storage devices. However, due to a reduction in the cost of semiconductor memories such as a NAND flash semiconductor device that has the largest storage capacity among semiconductor memories, and is able to retain stored data even when a power supply is cut off ensuring data persistence, new large capacity digital media storage devices, such as an SSD using semiconductor memories, have been actively employed.

Such an SSD has read and write speeds about 3-5 times faster than those of an existing HDD, and has random-address read and write speeds that are several hundred times faster than those of the existing HDD, satisfying the requirements of a database management system. In addition, the SSD operates silently, and the noise problems of existing HDDs may thereby be solved. Further, power consumption of the SSD is significantly lower compared to that of the existing HDD. Accordingly, the SSD is known as one of the most suitable apparatuses for digital devices that require low power usage, such as notebooks.

In addition, compared to the existing HDD, the SSD has stronger durability against external shock, and compared to the existing HDD having a uniform-shape, the shape of the SSD may be formed smaller and in various forms. Therefore, it is possible to reduce the size of electronic devices in which the SSD is used. Thus, the SSD may be applied in various applications.

With such advantages, the SSD may be widely and rapidly employed not only in desktop computers and notebook computers but also in storage mediums for search, home-shopping, or moving picture service servers, storage mediums for storing various types of research and development data, and even special equipment.

However, despite the aforementioned advantages, the SSD is at least about 5 times more expensive than the existing HDD, and the quality and reliability of the SSC still has to be verified, while the existing HDD has been used as a storage medium over the past 50 years for computers.

SUMMARY

According to an aspect of the inventive concept, there is provided a memory apparatus including a substrate having a controller; first and second connector pads arranged on the substrate; a first passive device pad arranged between the controller and the first connector pads; a second passive device pad arranged between the controller and the second connector pads; and a passive device coupled to only one of the first passive device pad or the second passive device pad.

The first and second connector pads may be respectively arranged on edges of top and bottom surfaces of the substrate, and each of the first and second passive device pads may include a pair of pads that are separated from each other.

The passive device may include a direct current (DC) block capacitor, and the memory apparatus may further include a via hole arranged between the controller and the first and second passive device pads, and the via hole being capable of conducting an electrical signal of the controller to the top and bottom surfaces of the substrate.

The first and second connectors may be different types of connectors, and the different types of connectors may include a SATA (Serial Advanced Technology Attachment) connector and a micro SATA (μSATA) connector.

The memory apparatus of claim may further include a plurality of memory devices electrically connected to the controller, and the plurality of memory devices may be a plurality of NAND flash devices.

According to another aspect of the inventive concept, there is provided a memory apparatus including a PCB having embedded thereon a controller; first and second connector pads arranged on edges of top and bottom surfaces of the PCB; a via hole arranged between the controller and the first and second connector pads; a first passive device pad arranged between the via hole and the first connector pads; a second passive device pad arranged between the via hole and the second connector pads; and a passive device coupled to only one of the first passive device pad or the second passive device pad, in which, when the first connector pads and the second connector pads are asymmetrically disposed on the top and bottom surfaces of the PCB, the first and second passive device pads are formed at a midpoint between the first connector pads and the second connector pads.

The first passive device pad and the second passive device pad may be symmetrical to each other on the top and bottom surfaces of the PCB, and second and fourth signal lines for respectively connecting the via hole and the first and second passive device pads may have a length within a range of about 0.1 mm through about 9.9 mm.

The PCB may be used in a Solid-State Drive (SSD).

The memory apparatus may further include a first signal line for connecting the controller and the via hole, a third signal line for connecting the first passive device pad and the first connector pads, and a fifth signal line for connecting the second passive device pad and the second connector pads.

Only one of the first connector pad or the second connector pad may be connected the controller through the passive device.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, the inventive concept will be described in detail by explaining exemplary embodiments of the inventive concept with reference to the attached drawings. The inventive concept may, however, be embodied in many different forms and should not be construed as being limited to the embodiments set forth herein. Rather, these embodiments are provided so that this disclosure will be thorough and complete and will fully convey the concept of the invention to those of ordinary skill in the art. As used herein, the term "and/or" includes any and all combinations of one or more of the associated listed items.

Figure 1:
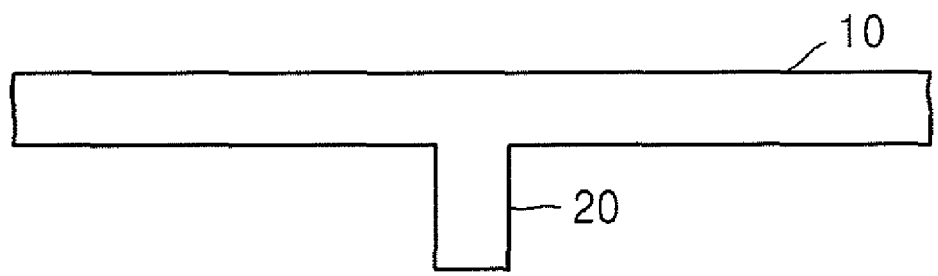
FIG. 1 is a diagram for describing an open-stub in a transmission line of an electronic device.
Figure 1:
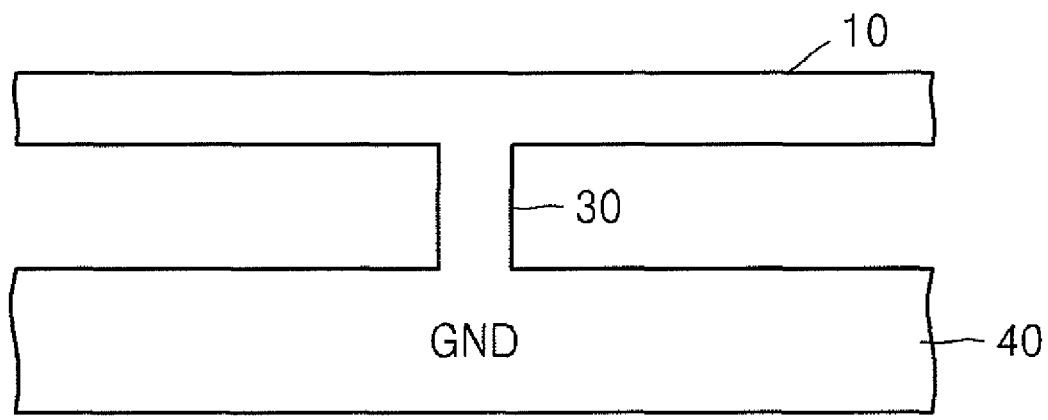

FIG. 1 is a diagram for describing an open-stub 20 in a transmission line 10 of an electronic device.

Referring to FIG. 1, a stub refers to a protrusion or a protruding piece, and the open-stub 20 in the transmission line 10 refers to a line other than a signal line that is additionally connected to the transmission line 10. Here, when the stub is not connected to another transmission line, it is referred to as the open-stub 20, and when the stub is connected to a ground line 40, it is referred to as a short-stub 30.

When a high frequency is applied to the transmission line 10, the open-stub 20 may operate as a capacitor or as an inductor according to a length of the open-stub 20, and thus the open-stub 20 may be used in impedance matching or as a filter of the transmission line 10.

Figure 2:
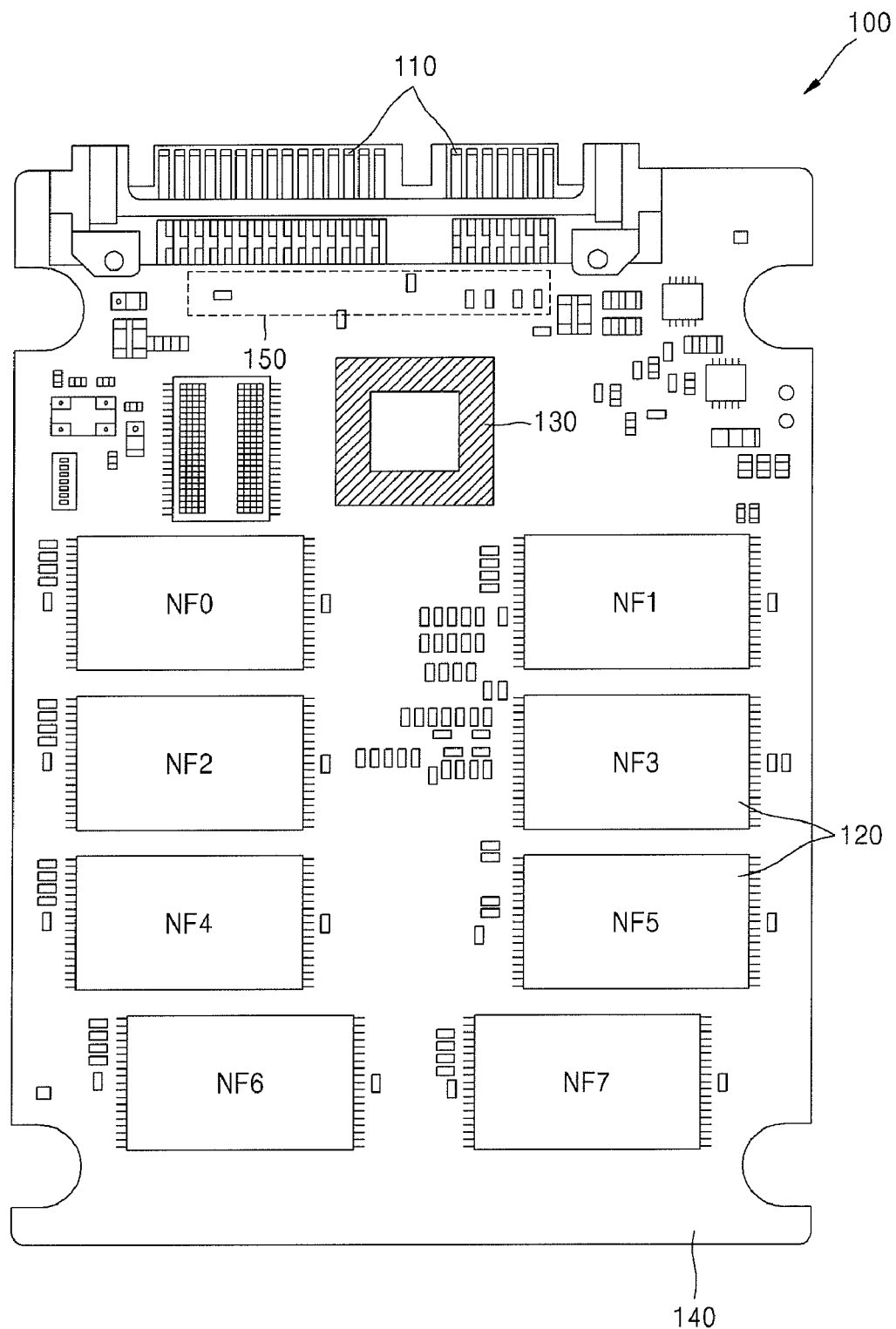
FIG. 2 is a plan view of a memory apparatus according to an embodiment of the inventive concept.

FIG. 2 is a plan view of a memory apparatus 100 according to an embodiment of the inventive concept.

Referring to FIG. 2, the memory apparatus 100, which may be a solid-state drive (SSD), includes a substrate such as a printed circuit board (PCB) 140 on which a controller 130 may be mounted to control a plurality of memory devices 120, such as NAND flash devices NF0 through NF7. A plurality of first connector pads 110 and a plurality of second connector pads 112 (not shown) may be respectively formed on edges of top and bottom surfaces of the PCB 140. The first connector pads 110 and the second connector pads 112 may be coupled to a SATA (Serial Advanced Technology Attachment) (not illustrated) connector or a micro SATA (µSATA) connector (not illustrated), which are generally used by current memory apparatuses to input/output data. In addition to these components, a semiconductor device for functioning as a buffer and a passive device may be mounted on the PCB 140.

In order for the controller 130 to communicate with two different types of connectors on the PCB 140 of the memory apparatus 100, a via hole and a passive device pad such as a capacitor pad may be formed on the PCB 140. Here, the passive device pad may include a pair of pads that are separated from each other. The via hole and the passive device pad may be disposed within a region indicated by reference numeral 150 in FIG. 2, and may be formed generally between the controller 130 and the first connector pads 110.

Figure 3:
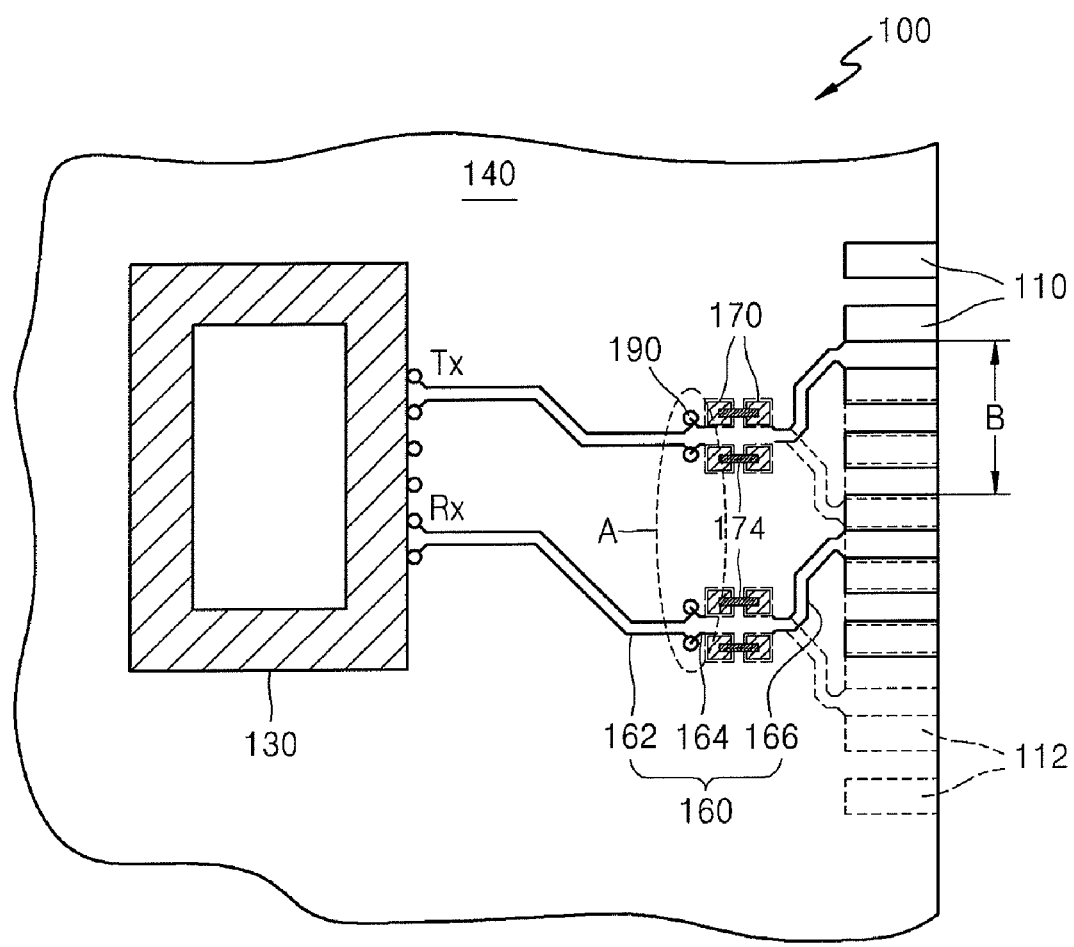
FIG. 3 is a partial plan view of a printed circuit board (PCB) on which a via hole and a passive device pad are disposed according to an embodiment of the inventive concept.
Figure 4:
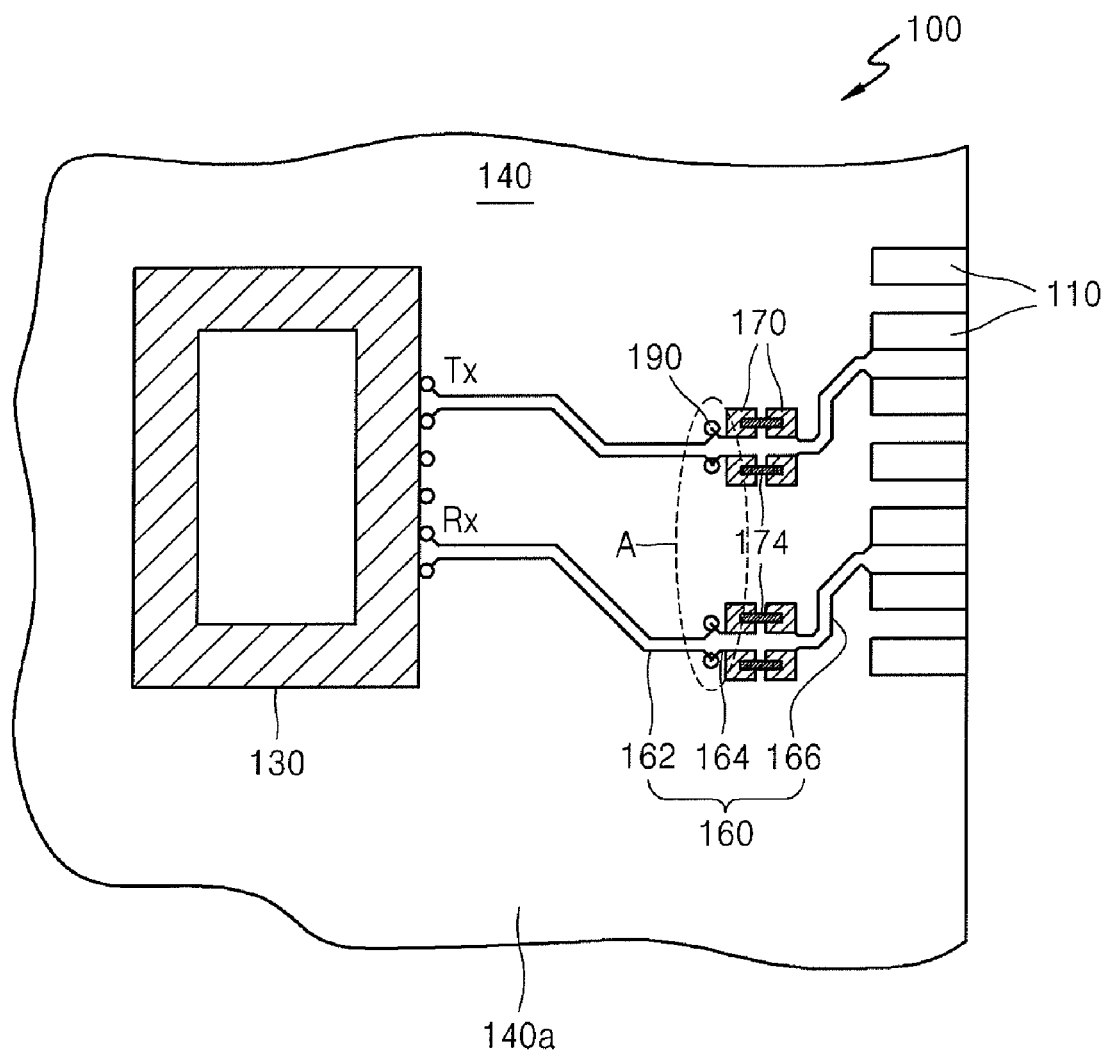
FIG. 4 is a plan view of structures of a top surface of the PCB in FIG. 3.
Figure 5:
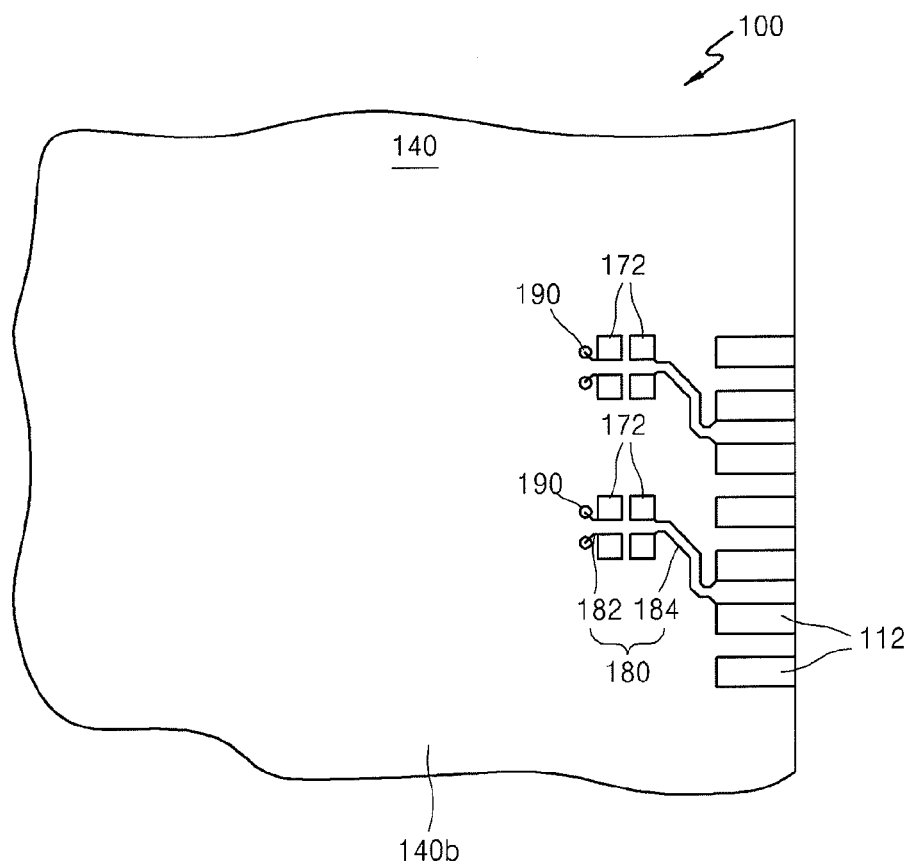
FIG. 5 is a plan view of structures of a bottom surface of the PCB in FIG. 3.

FIG. 3 is a partial plan view of the PCB 140 on which the via hole and the passive device pad are disposed according to an embodiment of the inventive concept. FIG. 4 is a plan view illustrating the structures disposed on the top surface 140a of the PCB 140 in FIG. 3. FIG. 5 is a plan view illustrating the structures disposed on the bottom surface 140b of the PCB 140 in FIG. 3.

FIG. 3 is a magnified view illustrating the structures disposed between the controller 130 and the first connector pads 110 shown in FIG. 2. In FIG. 3, a solid line indicates a structure formed on the top surface 140a of the PCB 140, and a dotted line indicates a structure formed on the bottom surface 140b of the PCB 140.

The memory apparatus 100 such as the SSD transmits and receives data that is exchanged with a memory device to and from the first connector pads 110 or the second connector pads 112 via transmission and reception signal lines Tx and Rx coupled to the controller 130. The first connector pads 110 and the second connector pads 112 may be respectively connected with the SATA connector and the µSATA connector that are different from each other. For smooth data exchange, the PCB 140 having the controller 130 has a via hole 190 and first and second passive device pads, such as first and second capacitor pads 170 and 172. The first connector pads 110 and the second connector pads 112 may be electrically connected to the via hole 190 in the PCB 140 and may be respectively formed on the edges of the top and bottom surfaces 140a, 140b of the PCB 140. The via hole 190 and the first and second capacitor pads 170 and 172 may be disposed between the controller 130 and the first connector pads 110 and the second connector pads 112. A passive device may be selectively mounted on the first or second capacitor pads 170 or 172.

The passive device may be a direct current (DC) block capacitor 174 capable of blocking a DC component and passing only an alternating current (AC) component. An overall operation of the memory apparatus 100 including the DC block capacitor 174 will be described in detail with reference to FIGS. 6 and 7. Referring to FIG. 4, the controller 130 for controlling the memory apparatus 100 such as the SSD may be connected to the via hole 190 via a first signal line 162, and the via hole 190 and the first capacitor pads 170 are connected via a second signal line 164. In addition, the first capacitor pad 170 may be connected to each of the first connector pads 110 via a third signal line 166. Thus, a top surface signal line 160 of the PCB 140 includes the first signal line 162, the second signal line 164, and the third signal line 166.

Referring to FIG. 5, the transmission signal lines Tx and the reception signal lines Rx coupled to the controller 130 and extending (conducting) from the top surface 140a to the bottom surface 140b of the PCB 140 via the via hole 190, are connected to the second capacitor pad 172 via a fourth signal line 182, and the second capacitor pad 172 is electrically connected to each of the second connector pads 112 via a fifth signal line 184. Thus, a bottom surface signal line 180 connects the via hole 190 and the second connector pads 112, and includes the fourth signal line 182 and the fifth signal line 184. Here, in the PCB 140, the transmission and reception signal lines Tx and Rx of the controller 130 are connected to the first connector pads 110 or the second connector pads 112 depending on the location of the passive device of FIG. 4, e.g., the DC block capacitor 174.

According to the present embodiment, the first connector pads 110 and the second connector pads 112 connected to the data transmission lines Tx may be asymmetrically disposed on the top and bottom surfaces 140a, 140b of the PCB 140, respectively, as illustrated in FIG. 3. In this case, if the first connector pads 110 and the second connector pads 112 are disposed apart a distance B, then the first and second capacitor pads 170 and 172 may be disposed intermediate, e.g., at a substantial midpoint, between the first connector pads 110 and the second connector pads 112, that is, at a substantial midpoint of the distance B in FIG. 3.

Here, the substantial midpoint between the first connector pads 110 and the second connector pads 112, that is, the substantial midpoint of the distance B in FIG. 3, may be an exact midpoint of the distance B, however, the substantial midpoint of the distance B may deviate by ±25% of the distance B from the exact midpoint of the distance B. That is, when the distance B between the first connector pads 110 and the second connector pads 112 is about 10 mm, the first and second capacitor pads 170 and 172 may be formed at a position about 2.5~7.5 mm.

In some other embodiments, the first capacitor pad 170 formed on the top surface 140a of the PCB 140, and the second capacitor pad 172 formed on the bottom surface 140b of the PCB 140 may be substantially symmetrical to each other on the top and bottom surfaces 140a, 140b of the PCB 140. In other words, the first capacitor pad 170 may be arranged on the top surface 140a of the PCB 140 substantially overlying the location of the second capacitor pad 172 on the bottom surface 140b of the PCB 140. With this structural arrangement, the trace length of the unused pads is minimized, thereby reducing stub effects.

Because the first capacitor pad 170 may be formed at the substantial midpoint between the first connector pads 110 and the second connector pads 112 (at half the distance B in FIG. 3) within the deviation of ±25%, a value within the deviation of ±25% is optimum for minimizing an effect due to impedance mismatching that may occur due to an open-stub, while permitting flexibility with respect to the disposition of the first and second capacitor pads 170 and 172 when designing the PCB 140. Impedance mismatching is where signal reflection, inductance, and capacitance, which may occur in the open-stub, may deteriorate signal transmission characteristics.

Figure 6:
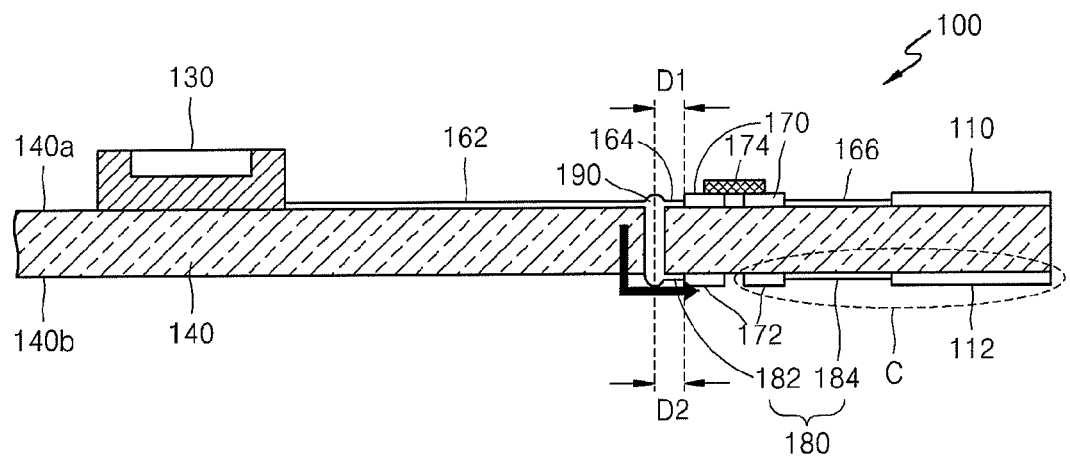
FIG. 6 is a cross-sectional view of the PCB of FIG. 3 cut along top and bottom surface signal lines and having a capacitor embedded on the top surface.
Figure 7:
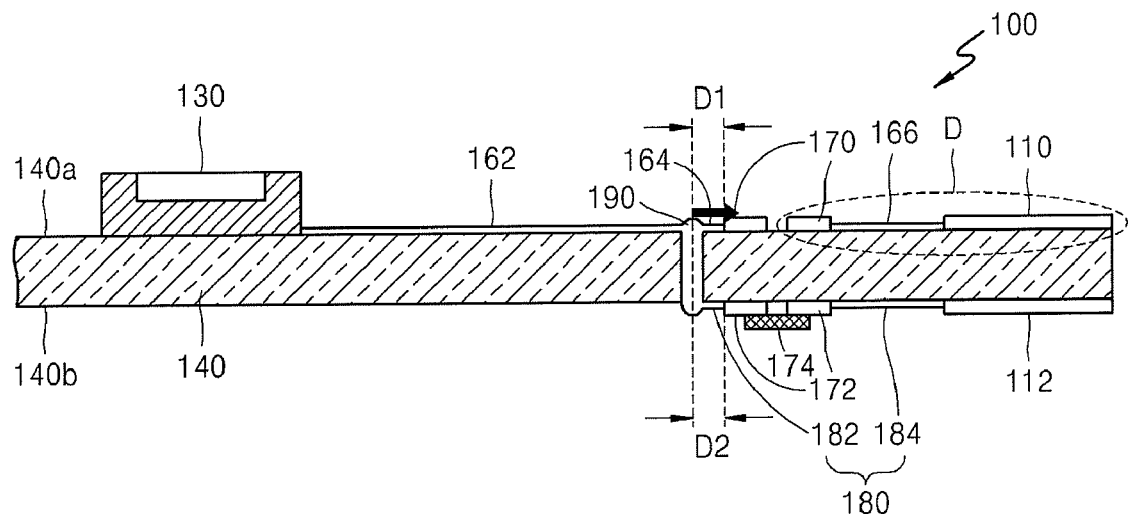
FIG. 7 is a cross-sectional view of the PCB of FIG. 3 cut along the top and bottom surface signal lines and having a capacitor embedded on the bottom surface.

FIG. 6 is a cross-sectional view of the PCB 140 of FIG. 3 taken along top and bottom surface signal lines 160, 180 and having a capacitor 174 mounted on the top surface 140a. FIG. 7 is a cross-sectional view of the PCB 140 of FIG. 3 taken along the top and bottom surface signal lines 160, 180 and having a capacitor 174 mounted on the bottom surface 140b.

Referring to FIG. 6, the DC block capacitor 174, the passive device, may be coupled to the first capacitor pad 170 on the top surface 140a of the PCB 140. Accordingly, transmission and reception signals of the controller 130 are communicated to the via hole 190 through the first signal line 162, and at the via hole 190, the transmission and reception signals are communicated to the first capacitor pad 170 via the second signal line 164. Here, since the DC block capacitor 174 may be coupled to the first capacitor pad 170, the first capacitor pad 170 blocks a DC component and exchanges only an AC component with the first connector pads 110 via the third signal line 166.

As illustrated in FIG. 6, the passive device, such as the DC block capacitor 174, may not be coupled to the second capacitor pad 172 formed on the bottom surface 140b of the PCB 140. Accordingly, at the second capacitor pad 172 formed on the bottom surface 140b of the PCB 140, there is a discontinuity in a transmission line, and thus delivery of the transmission and reception signals of the controller 130 is blocked from an area C in FIG. 6. Thus, a portion marked by an arrow may be an open-stub structure in the PCB 140.

Here, in order to reduce impedance mismatching due to the open-stub structure, the first and second capacitor pads 170 and 172 may be disposed at a midpoint between the first connector pads 110 and the second connector pads 112, when the first connector pads 110 and the second connector pads 112 are asymmetrically disposed as illustrated in FIG. 3. In addition, a length D1 of the second signal line 164 connecting the via hole 190 and the first capacitor pad 170 may be about 0.1~about 9.9 mm. The shorter the length D1, the better.

Thus, when the first connector pads 110 are for the SATA connector, and the second connector pads 112 are for the μSATA connector, the transmission and reception signals of the controller 130 may be communicated only to the first connector pads 110 on the top surface 140a of the PCB 140. Hence, although the PCB 140 has two different types of connector pads, i.e., the first connector pads 110 for the SATA connector and the second connector pads 112 for the μSATA connector, the PCB 140 may selectively use the first connector pads 110 or the second connector pads 112 depending on where the passive device, e.g., the DC block capacitor 174 is mounted.

Referring to FIG. 7, the memory apparatus 100 operates in a manner opposite to the memory apparatus 100 in FIG. 6. To be more specific, the DC block capacitor 174 may be coupled to the second capacitor pad 172 on the bottom surface 140b of the PCB 140. Accordingly, the transmission and reception signals of the controller 130 are communicated to the via hole 190 through the first signal line 162, and at the via hole 190, the transmission and reception signals are communicated to the second capacitor pad 172 via the fourth signal line 182. That is, through the via hole 190, the transmission and reception signals may be communicated from the top surface 140a of the PCB 140 to the bottom surface 140b thereof. Because the DC block capacitor 174 may be coupled to the second capacitor pad 172, the second capacitor pad 172 blocks a DC component and exchanges only an AC component with the second connector pads 112 through the fifth signal line 184.

As illustrated in FIG. 7, the DC block capacitor 174 may not be mounted on the first capacitor pad 170 formed on the top surface 140a of the PCB 140. Accordingly, at the first capacitor pad 170 formed on the top surface 140a of the PCB 140, there is a discontinuity in a transmission line, and thus delivery of the transmission and reception signals is blocked from an area D in FIG. 7. Thus, a portion marked by an arrow may be an open-stub structure in the top surface of the PCB 140.

To reduce impedance mismatching due to the open-stub structure, the first and second capacitor pads 170 and 172 are positioned as illustrated in FIG. 3, and a length D2 of the fourth signal line 182 connecting the via hole 190 and the second capacitor pad 172 may be about 0.1~about 9.9 mm. The shorter the length D2, the better.

When the first connector pads 110 are for the SATA connector, and the second connector pads 112 are for the μSATA connector, the transmission and reception signals of the controller 130 may be communicated only to the second connector pads 112 on the bottom surface 140b of the PCB 140. Hence, although the PCB 140 has two different types of connector pads (the first connector pads 110 and the second connector pads 112), since the DC block capacitor 174 is mounted only on the second capacitor pad 172 formed on the bottom surface 140b of the PCB 140, the PCB 140 may selectively use the μSATA connector mounted on the second connector pads 112. Thus, the one or more embodiments according to the inventive concept may selectively operate using the SATA connector as a first connector, or using the μSATA connector as a second connector, according to the location of the DC block capacitor 174 on the PCB 140.

Accordingly, the PCB 140 according to the embodiments is advantageous in that the PCB 140 may selectively use two different types of the first connector pads 110 and the second connector pads 112 by mounting the DC block capacitor 174, that is the passive device on the first capacitor pad 170 formed on the top surface of the PCB 140, or on the second capacitor pad 172 formed on the bottom surface 140b of the PCB 140.

Figure 8:
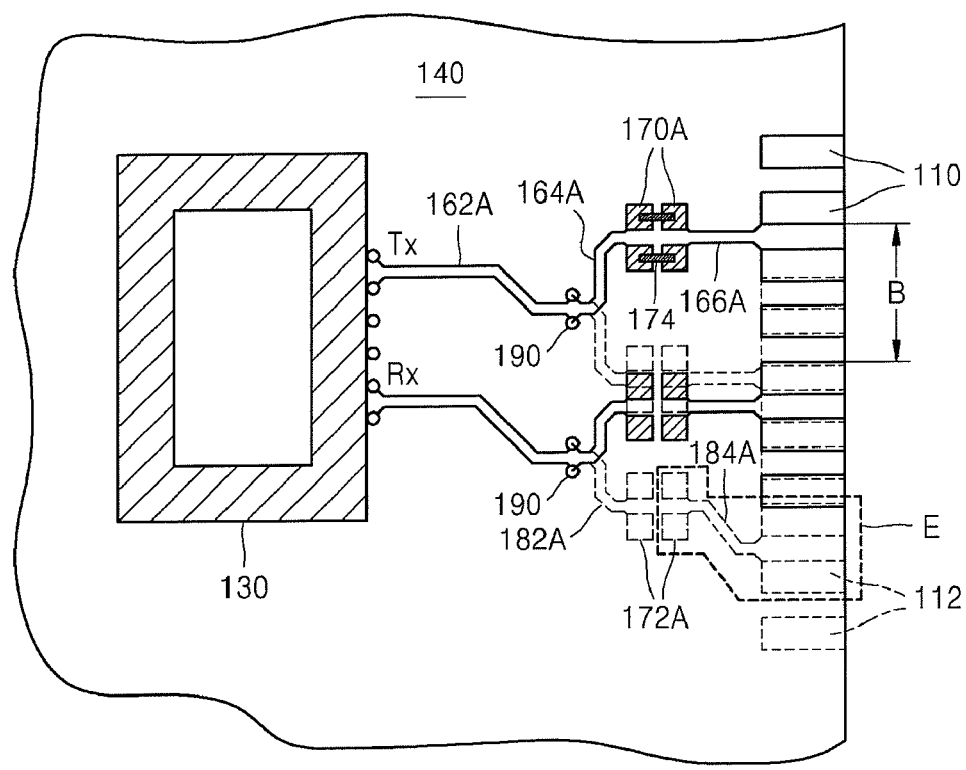
FIG. 8 is a partial plan view of the PCB on which the via hole and capacitor pads are disposed in a different manner than in FIG. 3, so as to describe advantages of the one or more embodiments of the inventive concept.

FIG. 8 is a partial plan view of the PCB 140 on which the via hole 190 and capacitor pads are disposed in a different manner as compared to FIG. 3, so as to describe advantages of some other embodiments of the inventive concept.

In FIGS. 3 and 4, the first and second capacitor pads 170 and 172 are disposed at the substantial midpoint between the first connector pads 110 and the second connector pads 112, which are asymmetrically disposed. However, in FIG. 8, a first capacitor pad 170A is disposed in parallel with the first connector pads 110. Also, a second capacitor pad 172A may be disposed in parallel with the second connector pads 112, in such a manner that the first capacitor pad 170A and the second capacitor pad 172A are asymmetrical to each other on top and bottom surfaces 140a, 140b of the PCB 140, i.e. laterally spaced apart from one another as between the top and bottom surfaces 140a, 140b of the PCB 140. In addition, a DC block capacitor 174A, a passive device, is mounted on the first capacitor pad 170A.

Thus, the transmission and reception signals of the controller 130 are not communicated to an area E in FIG. 8, which includes a portion of the second capacitor pad 172A, a fifth signal line 184A, and the second connector pads 112 in the PCB 140. Also, a fourth signal line 182A on the bottom surface 140b of the PCB 140 connected to the via hole 190 on the top surface of the PCB 140 has an open-stub structure with respect to a top surface signal line including signal lines 162A, 164A, and 166A.

Here, the fourth signal line 182A having the open-stub structure by being connected to the second capacitor pad 172A at the bottom surface 140b of the PCB 140 via the via hole 190 has a length that is relatively longer than the fourth signal line 182 in FIG. 3. Since the length of the fourth signal line 182A having the open-stub structure is relatively longer, impedance mismatching occurs in the open-stub structure, such that signal characteristics may deteriorate in high-speed operations.

Figure 9:
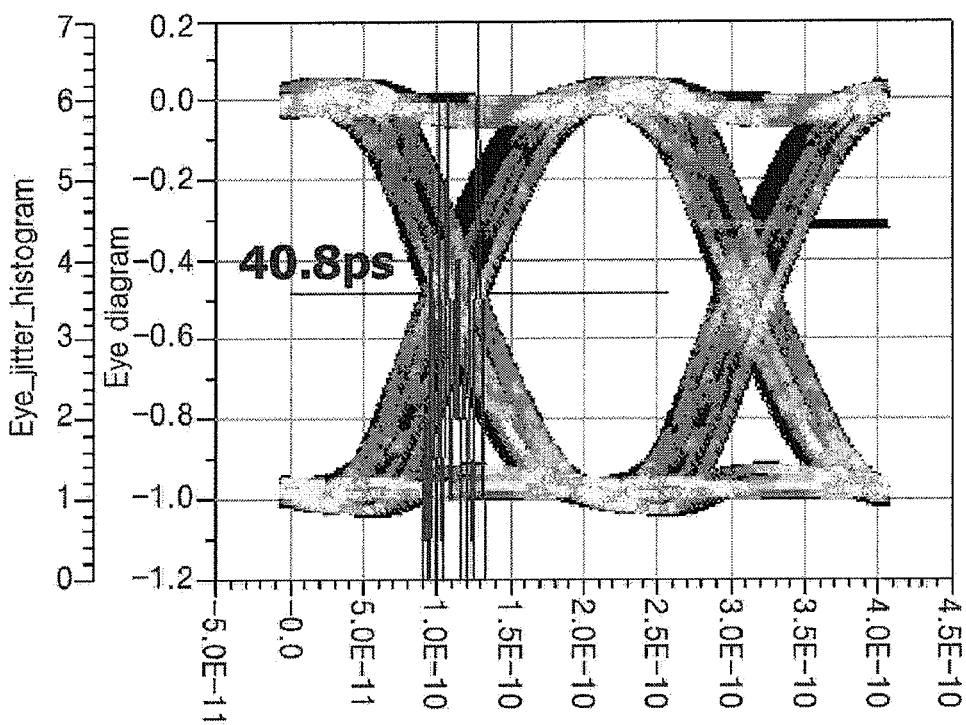
FIGS. 9 and 10 are Jitter diagrams for describing advantages of the one or more embodiments of the inventive concept.
Figure 10:
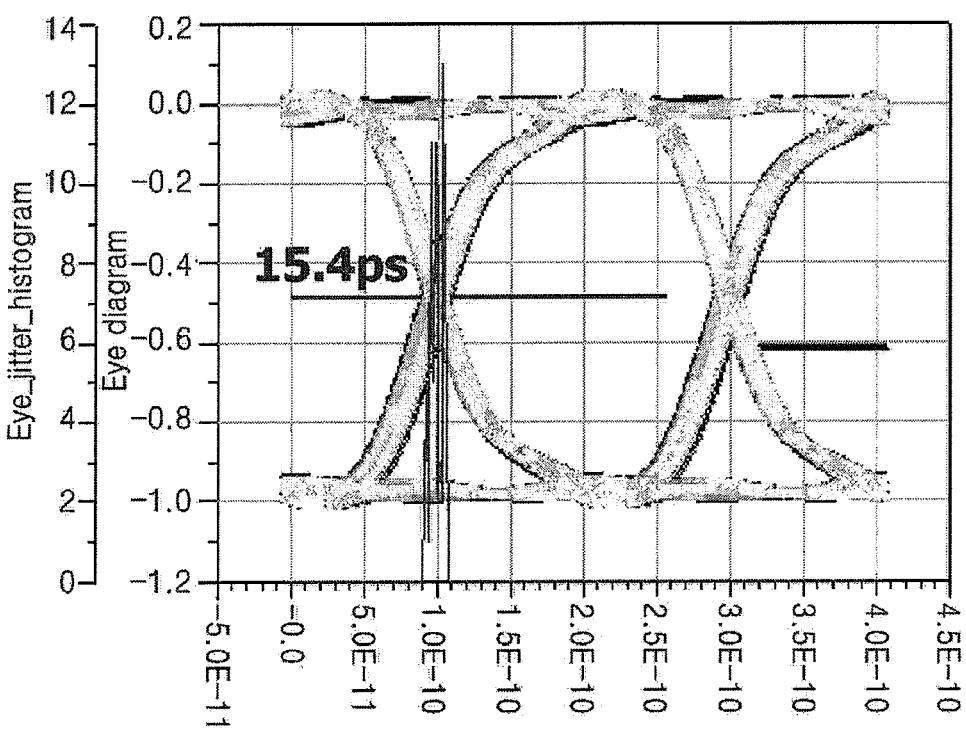

FIGS. 9 and 10 are Jitter diagrams for describing advantages of the embodiments of the inventive concept.

Referring to FIGS. 9 and 10, a Jitter diagram indicates a graph for exhibiting wave variation or wave fluctuation in a high frequency digital signal, and expresses deviation from an ideal signal frequency.

The Jitter diagram of FIG. 9 indicates a case in which first and second capacitor pads are disposed in parallel with first and second connector pads, as in FIG. 8. The Jitter diagram of FIG. 10 indicates a case in which first and second capacitor pads are disposed at a substantial midpoint between first and second connector pads that are asymmetrically disposed, as in the embodiment of the inventive concept of FIG. 3.

In the case of FIG. 9, a Jitter value indicates that a measured frequency deviation from an ideal frequency standard value is 40.8 ps. However, when the first and second capacitor pads are optimally disposed at the substantial midpoint between the first and second connector pads as in the embodiments of the inventive concept, referring to FIG. 10, the Jitter value indicates that the measured frequency deviation from the ideal frequency standard value is 15.4 ps. This means that approximately 62.2% of signal characteristics are improved in the case of FIG. 10, compared to that of FIG. 9.

Figure 11:
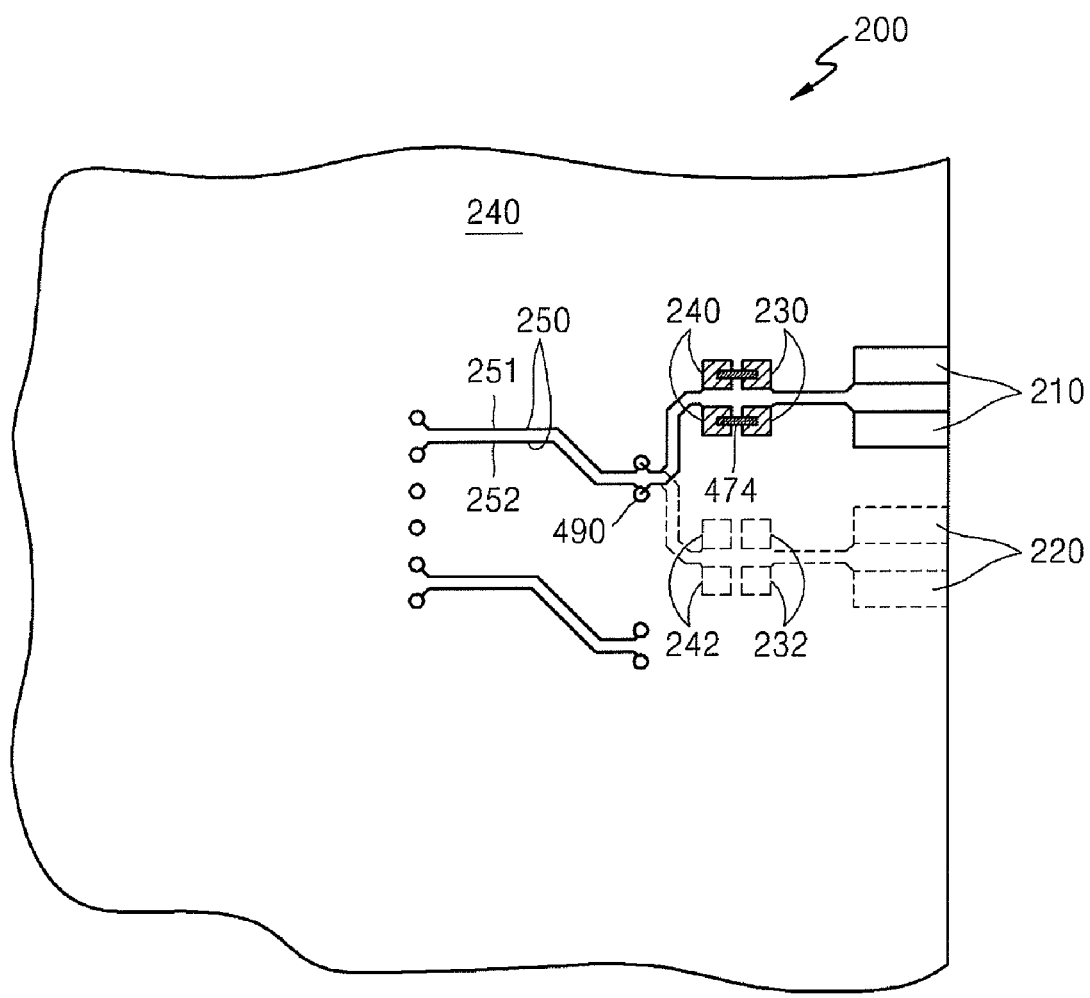
FIG. 11 is a partial plan view of an apparatus including a differential signal pair according to one embodiment of the inventive concept.

In one embodiment shown in FIG. 11, which illustrates a portion of a memory apparatus 200, which includes a substrate 240. In addition, first and second connector pad pairs 210, 220 are arranged on the substrate 240 and coupled respectively to first and second passive device pad pairs 230, 232. Further, the apparatus 200 includes third and fourth passive device pad pairs 240, 242. The substrate 240 includes a via hole 490 which functions similar to the via hole 190 discussed above. Also, a differential signal pair 250 (e.g., a Tx signal pair or an Rx signal pair) may be associated with or defined by first and second conductors 251, 252. The first conductor 251 may be coupled to one pad of the third passive device pad pair 240 and one pad of the fourth passive device pad pair 242. The second conductor 252 may be coupled to the other pad of the third passive device pad pair 240 and to the other pad of the fourth passive device pad pair 242. According to some embodiments, a pair of passive devices 474 may be provided to respectively couple either the first passive device pad pair 230 to the third passive device pad pair 240 or the second passive device pad pair 232 to the fourth passive device pad pair 242. Therefore, serial data transmission occurs on the transmission differential signal pair Tx and on the reception differential signal pair Rx. Each pair carries a differential signal such as shown in the eye Jitter plots of FIGS. 9 and 10. In order to communicate differential signals to and from a connected device (not shown), each differential signal pair must connect to a connector pad pair 210, 220 on the edge of the substrate 240. This embodiment can be applied to any suitable electronic device using a differential transmitter and/or differential receiver. In one embodiment, transmitter and receivers may be located on a controller (not shown). Other embodiments can terminate the differential pairs at, e.g., a memory device or a separate serdes (serializer/deserializer) device (not shown).

Figure 12:
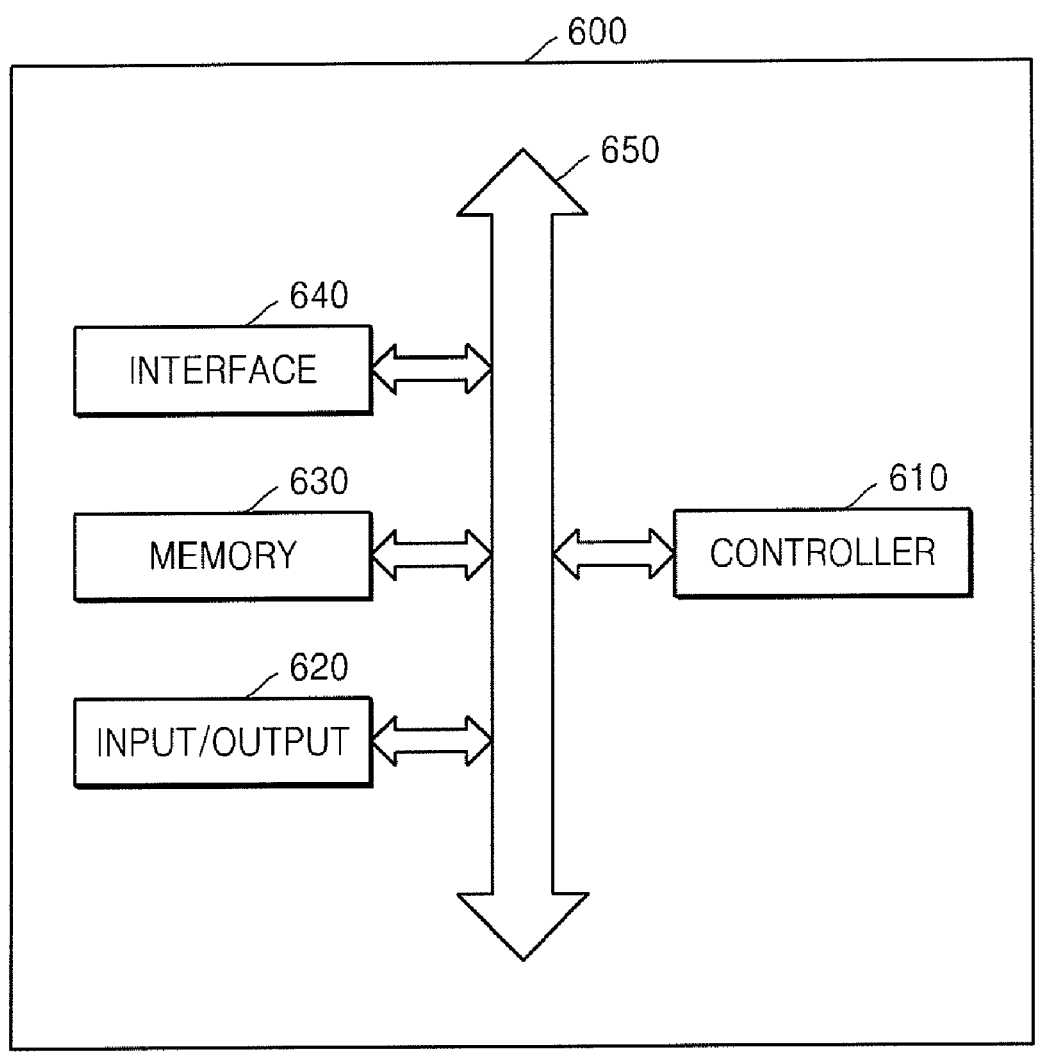
FIG. 12 is a block diagram of an electronic device to which the memory apparatus is applied according to another embodiment of the inventive concept.

In some embodiments, although it is shown in FIG. 12, the first passive device pad pair 230 and the second passive device pad pair 232 are asymmetrical, i.e. laterally spaced apart from one another, to each other on top and bottom surfaces of the substrate 240, the first passive device pad pair 230 and the second passive device pad pair 232 may be disposed symmetrical to each other on top and bottom surfaces of the substrate 240, i.e., the first passive device pad pair 230 substantially overlying or directly overlying the second passive device pad pair 232.

FIG. 12 is a block diagram of an electronic device 600 to which the memory apparatus 100 is employed according to another embodiment of the inventive concept.

Referring to FIG. 12, the electronic device 600 may include a controller 610, an input/output unit 620, a memory apparatus 630, and an interface 640. The electronic device 600 may include a mobile system or an information transmitting and receiving system. The mobile system may include personal digital assistants (PDAs), portable computers, web tablets, wireless phones, mobile phones, and digital music players.

The controller 610 may execute a program and control the electronic device 600. The controller 610 may be a microprocessor, a digital signal processor, a microcontroller, or a device similar to these devices. The input/output unit 620 may be used to input data to or output data from the electronic device 600. The electronic device 600 may be connected to an external device such as a personal computer (PC) or a network by using the input/output unit 620, and may exchange data with the external device. The input/output unit 620 may be a keypad, a keyboard, or a display. The memory apparatus 630 may store codes and/or data for operation of the controller 610, or may store data processed by the controller 610. The memory apparatus 630 may include the memory apparatus 100 or other apparatus according to some embodiments.

The interface 640 may be a data transmission path between the electronic device 600 and other external devices. The controller 610, the input/output unit 620, the memory apparatus 630, and the interface 640 may communicate with each other via a bus 650. For example, such an electronic device 600 may be used for mobile phones, MPEG-1 Audio Layer 3 (MP3) players, navigations, Portable Multimedia Players (PMPs), SSDs, or household appliances. Selectively, the electronic device 600 may be a desktop computer, a notebook computer, a MP3 player, a PMP, a navigation system, an electronic dictionary, an external memory device, a mobile phone, a medical equipment, an image reproducing device, a flat panel display device, a surveillance camera system, or a database server.

In the present description, terms such as 'first', 'second', etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the teaching of the present general inventive concept.

Relative terms, such as "under," "lower," "bottom," "on," "upper," and/or "top", may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "upper" side of other elements would then be oriented on "lower" sides of the other elements. The exemplary term "upper", can therefore, encompass both an orientation of "lower" and "upper", depending of the particular orientation of the figure.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Various operations will be described as multiple discrete steps performed in a manner that is most helpful in understanding the invention. However, the order in which the steps are described does not imply that the operations are order-dependent or that the order that steps are performed must be the order in which the steps are presented.

While the inventive concept has been particularly shown and described with reference to exemplary embodiments thereof, it will be understood that various changes in form and details may be made therein without departing from the spirit and scope of the following claims.

What is claimed is:

1. An apparatus comprising:
a substrate having a controller;
first and second connector pads arranged on the substrate;
a first passive device pad arranged between the controller and the first connector pads;
a second passive device pad arranged between the controller and the second connector pads; and
a passive device coupled to only one of the first passive device pad or the second passive device pad.

2. The memory apparatus of claim 1, wherein the first and second connector pads are respectively arranged on edges of top and bottom surfaces of the substrate.

3. The memory apparatus of claim 1, wherein each of the first and second passive device pads comprises a pair of pads that are separated from each other.

4. The memory apparatus of claim 1, wherein the passive device comprises a direct current (DC) block capacitor.

5. The memory apparatus of claim 1, wherein a via hole is arranged between the controller and the first and second passive device pads, and the via hole being capable of conducting an electrical signal of the controller to the top and bottom surfaces of the substrate.

6. The memory apparatus of claim 1, wherein the first and second connectors are different types of connectors.

7. The memory apparatus of claim 6, wherein the different types of connectors comprise a SATA connector and a micro SATA (μSATA) connector.

8. The memory apparatus of claim 1, further comprising a plurality of memory devices electrically connected to the controller.

9. The memory apparatus of claim 8, wherein the plurality of memory devices are a plurality of NAND flash devices.

* * * * *